(12) United States Patent
Dong et al.

(10) Patent No.: US 11,309,519 B2
(45) Date of Patent: Apr. 19, 2022

(54) DISPLAY PANEL, MANUFACTURING METHOD THEREOF, AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Xiangdan Dong, Beijing (CN); Youngyik Ko, Beijing (CN); Ming Hu, Beijing (CN); Weiyun Huang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 202 days.

(21) Appl. No.: 16/611,246

(22) PCT Filed: Mar. 22, 2019

(86) PCT No.: PCT/CN2019/079285
§ 371 (c)(1),
(2) Date: Nov. 6, 2019

(87) PCT Pub. No.: WO2020/098199
PCT Pub. Date: May 22, 2020

(65) Prior Publication Data
US 2021/0336209 A1 Oct. 28, 2021

(30) Foreign Application Priority Data
Nov. 16, 2018 (CN) .......................... 201811365453.9

(51) Int. Cl.
*H01L 27/14* (2006.01)
*H01L 51/52* (2006.01)
(Continued)

(52) U.S. Cl.
CPC ...... *H01L 51/5253* (2013.01); *H01L 51/0097* (2013.01); *H01L 51/56* (2013.01); *H01L 27/3244* (2013.01); *H01L 2227/323* (2013.01)

(58) Field of Classification Search
CPC ........................... H01L 51/5253; H01L 51/56
See application file for complete search history.

(56) References Cited

U.S. PATENT DOCUMENTS 10,230,067 B2 * 3/2019 Chung ................ H01L 51/5237
10,332,947 B2 * 6/2019 Kim ..................... H01L 51/5253
(Continued)

FOREIGN PATENT DOCUMENTS

CN 106373990 A 2/2017
CN 107946341 A 4/2018
(Continued)

OTHER PUBLICATIONS

International Search Report dated Aug. 15, 2019, issued in counterpart International Application No. PCT/CN2019/079285 (11 pages).
(Continued)

*Primary Examiner* — Caleb E Henry
(74) *Attorney, Agent, or Firm* — WHDA, LLP (57) ABSTRACT

The present disclosure relates to a display panel comprising a display area. The display area may include a substrate having a third opening, a thin film transistor layer on a side of the substrate, a light emitting layer on a side of the thin film transistor layer opposite from the substrate, and an encapsulation layer on a side of the light emitting layer opposite from the substrate. The thin film transistor layer may have a first opening to expose the third opening and the
(Continued)

encapsulation layer may have a second opening to expose the third opening. Orthographic projection of the second opening on the substrate may cover orthographic projection of the third opening on the substrate.

20 Claims, 9 Drawing Sheets

(51) Int. Cl.
*H01L 51/00* (2006.01)
*H01L 51/56* (2006.01)
*H01L 27/32* (2006.01)

(56) References Cited

U.S. PATENT DOCUMENTS

| | | | |
|---|---|---|---|
| 10,418,434 B2* | 9/2019 | Kim | H01L 27/3276 |
| 10,476,032 B2* | 11/2019 | Park | H01L 27/3276 |
| 2017/0148856 A1* | 5/2017 | Choi | H01L 51/0096 |
| 2017/0162637 A1* | 6/2017 | Choi | G09G 3/20 |
| 2018/0294436 A1* | 10/2018 | Choi | H01L 51/0097 |
| 2019/0123115 A1* | 4/2019 | Sun | H01L 51/5253 |

FOREIGN PATENT DOCUMENTS

| | | |
|---|---|---|
| CN | 108258145 A | 7/2018 |
| CN | 108400152 A | 8/2018 |
| CN | 108428807 A | 8/2018 |
| CN | 108666347 A | 10/2018 |

OTHER PUBLICATIONS

Office Action dated Nov. 17, 2020, issued in counterpart CN Application No. 201811365453.9, with English Translation. (13 pages).

* cited by examiner

DISPLAY PANEL, MANUFACTURING METHOD THEREOF, AND DISPLAY APPARATUS

CROSS-REFERENCE TO RELATED APPLICATIONS

This application claims benefit of the filing date of Chinese Patent Application No. 201811365453.9 filed on Nov. 16, 2018, the disclosure of which is hereby incorporated in its entirety by reference.

TECHNICAL FIELD

The present disclosure relates to display technology, in particular, to a display panel, a manufacturing method thereof and a display apparatus.

BACKGROUND

At present, a camera of a mobile terminal such as a mobile phone is mostly disposed in a non-display area of the screen, such as an upper border of the screen, thereby making the size of the frame larger.

In the related art, in order to reduce the size of the frame, the camera is set in the display area.

BRIEF SUMMARY

An embodiment of the present disclosure provides a display panel comprising a display area. The display area may include a substrate having a third opening; a thin film transistor layer on a side of the substrate, a light emitting layer on a side of the thin film transistor layer opposite from the substrate; and an encapsulation layer on a side of the light emitting layer opposite from the substrate. The thin film transistor layer may have a first opening to expose the third opening and the encapsulation layer may have a second opening to expose the third opening. Orthographic projection of the second opening on the substrate may cover orthographic projection of the third opening on the substrate.

Optionally, the encapsulation layer further covers side surfaces of the light emitting layer and the thin film transistor layer facing the second opening.

Optionally, orthographic projection of the first opening on the substrate covers the orthographic projection of the second opening on the substrate, and an area of the orthographic projection of the first opening on the substrate is greater than an area of the orthographic projection of the second opening on the substrate.

Optionally, at least one dam surrounding the third opening is provided on a side of the thin film transistor layer opposite from the substrate; and at least a portion of the light emitting layer is located on a side of the at least one dam opposite from the third opening.

Optionally, the at least one dam includes a first dam and a second dam located on a side of the first dam opposite from the third opening.

Optionally, a height of the first dam is greater than a height of the second dam.

Optionally, the light emitting layer comprises a first portion covering a side surface of the second dam opposite from the third opening and a surface of a portion of the thin film transistor layer on a side of the second dam opposite from the third opening.

Optionally, the light emitting layer comprises a first portion covering a surface of a portion of the thin film transistor layer on a side of the second dam opposite from the third opening.

Optionally, the light emitting layer further comprises a second portion covering at least a portion of surfaces of the first dam and the second dam.

Optionally, the second portion further covers a surface of a portion of the thin film transistor layer on a side of the first dam facing the third opening.

Optionally, the second portion is contiguous with the first portion.

One example of the present disclosure is a display apparatus, comprising the display panel according to one embodiment of the present disclosure.

Optionally, the display apparatus further comprises a camera disposed in the third opening.

One example of the present disclosure is a method of manufacturing a display panel comprising forming a display area. The forming the display area comprises providing a substrate; forming a thin film transistor layer on a side of the substrate, the thin film transistor layer having a first opening exposing a portion of the substrate; forming a light emitting layer on a side of the thin film transistor layer opposite from the substrate; forming an encapsulation layer covering the light emitting layer and the thin film transistor layer, the encapsulation layer having a second opening exposing at least a portion of the exposed portion of the substrate; and forming a third opening penetrating the exposed portion of the substrate. Orthographic projection of the second opening on the substrate coven orthographic projection of the third opening on the substrate.

Optionally, orthographic projection of the first opening on the substrate covers the orthographic projection of the second opening on the substrate, and an area of the orthographic projection of the first opening on the substrate is greater than an area of the orthographic projection of the second opening on the substrate.

Optionally, the method of manufacturing a display panel, before forming the light emitting layer and the encapsulation layer, further comprises forming at least one dam located on a side of the thin film transistor layer opposite from the substrate. At least a portion of the light emitting layer is located on a side of the at least one dam opposite from the first opening.

Optionally, the forming the light emitting layer and the encapsulation layer comprises depositing a layer of light emitting material after forming the at least one dam; forming a first inorganic material layer on a side of the layer of the light emitting material opposite from the substrate; performing an etching process to remove portions of the layer of the light emitting material and the first inorganic material layer in the first opening; forming an organic material layer on a side of the at least one dam opposite from the first opening and on a side of the remaining portion of the first inorganic material layer opposite from the substrate; and forming a second inorganic material layer covering the organic material layer, the layer of the light emitting material, and the at least one dam. The second inorganic material layer has an opening the same as the second opening.

Optionally, the etching process is performed to further remove portions of the layer of the light emitting material and the first inorganic material layer except those located at a side of the second dam opposite from the first opening.

Optionally, the at least one dam comprises a first dam and a second dam located on a side of the first dam opposite from the first opening.

Optionally, a height of the first dam is greater than a height of the second dam.

BRIEF DESCRIPTION OF THE DRAWINGS

The subject matter which is regarded as the disclosure is particularly pointed out and distinctly claimed in the claims at the conclusion of the specification. The foregoing and other objects, features, and advantages of the present disclosure are apparent from the following detailed description taken in conjunction with the accompanying drawings in which:

FIGS. 4E'-4H' are schematic cross-sectional views of structures formed in different stages of a display area in a method of fabricating a display panel in accordance with some embodiments of the present disclosure.

DETAILED DESCRIPTION

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-4H'. When referring to the figures, like structures and elements shown throughout are indicated with like reference numerals. It should be understood that the dimensions of the various parts shown in the drawings are not drawn in the actual scale.

Unless otherwise defined, technical terms or scientific terms used in the present disclosure are intended to be in the ordinary meaning of those of ordinary skill in the art. The words "first," "second" and similar words used in the present disclosure do not denote any order, quantity or importance, but are merely used to distinguish different components. The words "including" or "comprising" and the like mean that the element or the item preceding the word includes the element or item listed after the word and its equivalent and do not exclude other components or objects. "Coupled" and the like are not limited to physical or mechanical connections, but may include electrical connections, whether direct or indirect. "Upper," "lower," "left," "right," etc. are only used to indicate the relative positional relationship. When the absolute position of the object being described is changed, the relative positional relationship may also change accordingly. It should be noted that the relative arrangement of the components and steps, compositions of the materials, numerical expressions and the numerical values set forth in the embodiments are to be construed as illustration only and not as limitation.

In the description of the following embodiments, specific features, structures, materials or characteristics may be combined in any suitable manner in any one or more embodiments or examples.

In the present disclosure, when it is described that a particular component is located between the first component and the second component, there may be intervening components between the particular component and the first component or the second component, or there may be no intervening components. When it is described that a particular component is connected to other components, that particular component may be directly connected to the other components without intervening components, or may be indirectly connected to the other components with intervening components.

All terms (including technical or scientific terms) used in the present disclosure have the same meaning as understood by one of ordinary skill in the art to which this disclosure belongs, unless specifically defined otherwise. It should also be understood that terms defined in, for example, a general dictionary should be interpreted as having a meaning consistent with their meaning in the context of the related art, without the use of idealized or extremely formal meanings, unless explicitly stated herein.

Techniques, methods and apparatus known to those of ordinary skill in the relevant art may not be discussed in detail, but the techniques, methods and apparatus should be considered as part of the specification, where appropriate.

Figure 1:
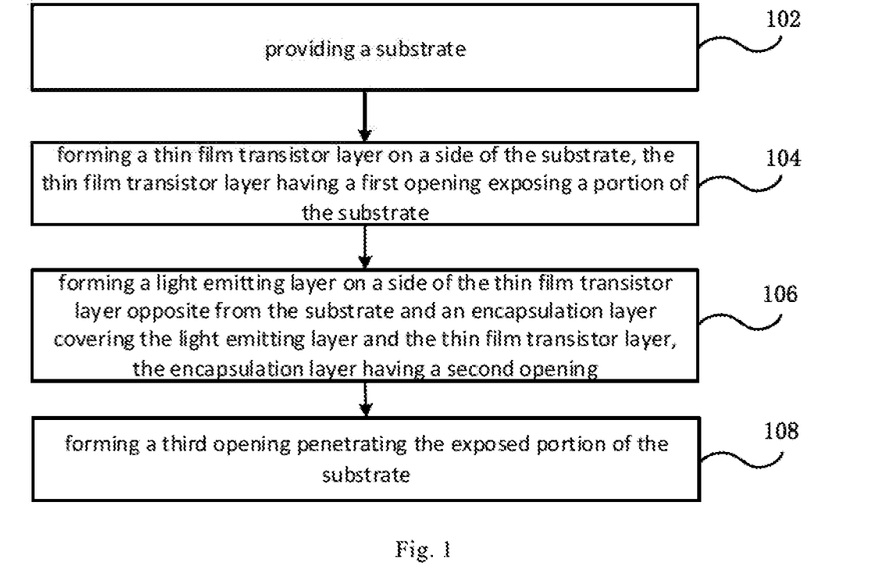
FIG. 1 is a flow chart showing formation of a display area in a method of manufacturing a display panel according to some embodiments of the present disclosure.
Figure 2A:
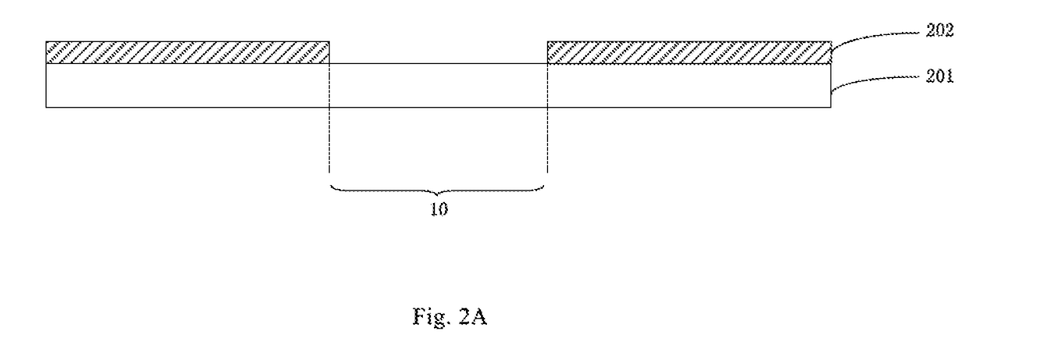
FIGS. 2A-2C illustrate cross-sectional schematic views of structures formed in different stages of forming a display area in a method of fabricating a display panel in accordance with some embodiments of the present disclosure.
Figure 2B:
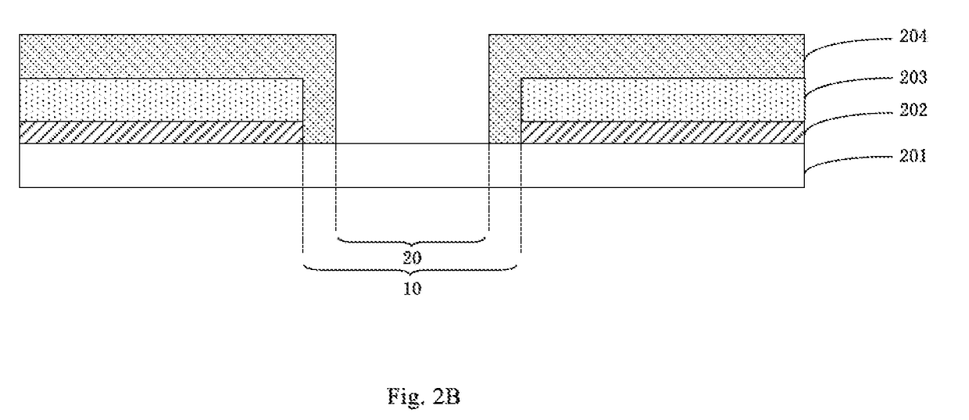
Figure 2C:
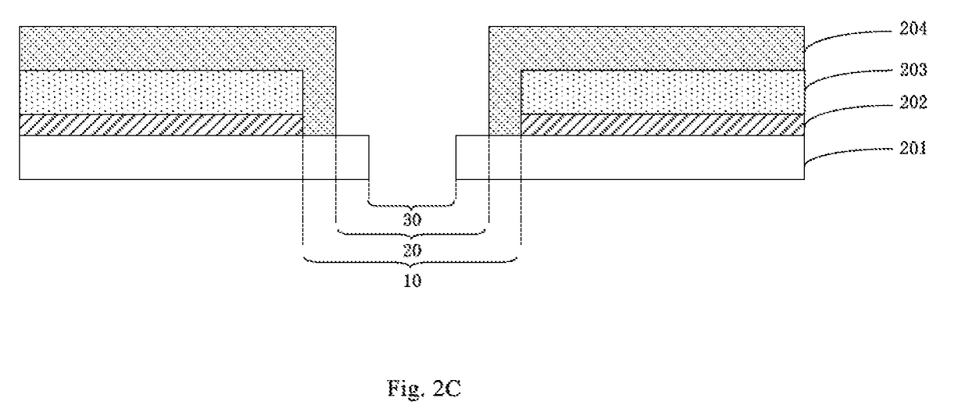

FIG. 1 is a flow diagram of forming a display area in a method of fabricating a display panel in accordance with some embodiments of the present disclosure. FIGS. 2A-2C illustrate cross-sectional schematic views of structures formed in different stages of forming a display area in a method of fabricating a display panel in accordance with some embodiments of the present disclosure.

The process of forming the display area in the method of fabricating the display panel will be described in detail below with reference to FIGS. 1 and 2A-2C.

At step 102, a substrate 201 is provided as shown in FIG. 2A. It should be understood that FIGS. 2A-2C only show the substrate 201 located in the display area. In some embodiments, the material of the substrate may include, for example, a flexible material such as polyimide (PI).

At step 104, a thin film transistor layer 202 on one side of the substrate 201 is formed as shown in FIG. 2A. The thin film transistor layer 202 has a first opening 10 that exposes a portion of the substrate 201. The thin film transistor layer may include a thin film transistor array, a planarization layer covering the thin film transistor array, and an anode layer on the planarization layer and connected to the thin film transistor array.

At step 106, a light emitting layer 203 is formed on the side of the thin film transistor layer 202 opposite from the substrate 201. Furthermore, an encapsulation layer 204 covering the light emitting layer 203 and the thin film transistor layer 202 are formed, as shown in FIG. 2B. The encapsulation layer 204 has a second opening 20 that exposes a portion of the substrate 201.

In one embodiment, the light emitting layer 203 includes an organic light emitting material layer on the side of the thin film transistor layer 202 opposite from the substrate 201 and a cathode layer on the side of the organic light emitting material layer opposite from the thin film transistor layer 202. In some embodiments, the light emitting layer 203 may further include one or more layers of an electron transport layer, an electron injection layer, a hole transport layer, and a hole injection layer. In one embodiment, the light emitting layer 203 may further include a layer such as a LiF layer for improving light extraction efficiency on a side of the cathode layer opposite from the organic light emitting material layer.

The encapsulation layer 204 may include a first inorganic material layer, a second inorganic material layer, and an organic material layer between the first inorganic material layer and the second inorganic material layer.

At step 108, a third opening 30 is formed through the exposed portion of the substrate 201, as shown in FIG. 2C.

Here, the third opening 30 and the second opening 20 connected with the third opening 30 are not used for display. In one embodiment, the formed third opening 30 and second opening 20 can be used to set up a camera.

Figure 3:
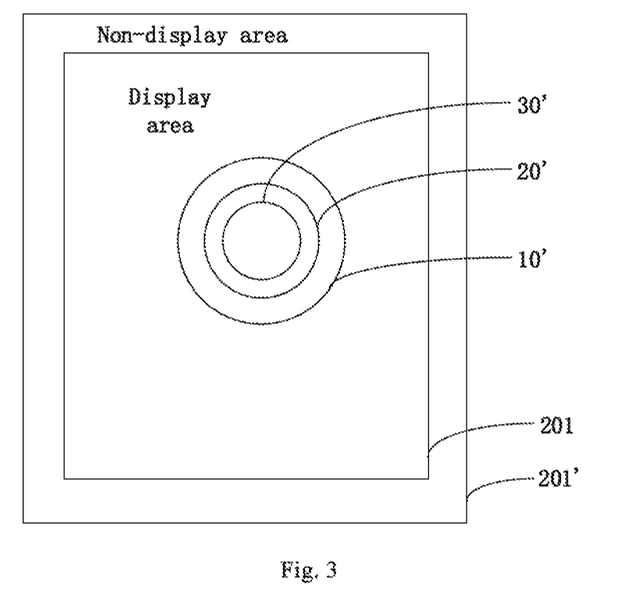
FIG. 3 shows a schematic view of an orthographic projection of a first opening, a second opening, and a third opening on a substrate in a display area of a display panel in accordance with some embodiments of the present disclosure.

FIG. 3 shows a schematic view of orthographic projection of a first opening, a second opening, and a third opening on a substrate in a display area of a display panel. It is to be noted that FIG. 3 shows not only the substrate 201 in the display area, but also the substrate 201' in the non-display area surrounding the display area. The combination of the substrate 201 and the substrate 201' constitutes the substrate of the display panel.

For convenience of explanation, the orthographic projection of the first opening 10 on the substrate 201 is hereinafter referred to as a first projection 10', the orthogonal projection of the second opening 20 on the substrate 201 is referred to as a second projection 20', and the orthographic projection of the third opening 30 on the substrate 201 is referred to as a third projection 30'. Here, the second projection 20' covers the third projection 30'.

In some embodiments, the first projection 10' covers the second projection 20', and the area of the first projection 10' can be larger than the area of the second projection 20'. In some embodiments, the shape of the first projection 10', the second projection 20', and the third projection 30' may be selected from one or more of a circle (as shown in FIG. 3), an ellipse, a square, and the like.

In the above embodiments, the size of the third opening of the substrate in the display area is not larger than the size of the second opening of the encapsulation layer in the display area. In such a structure, the encapsulation layer covers the edge of the light-emitting layer facing the first opening, thereby preventing moisture from entering the light-emitting layer through the edge of the light-emitting layer closer to the first opening. As a result, the display effect of the display panel is improved.

Figure 4A:
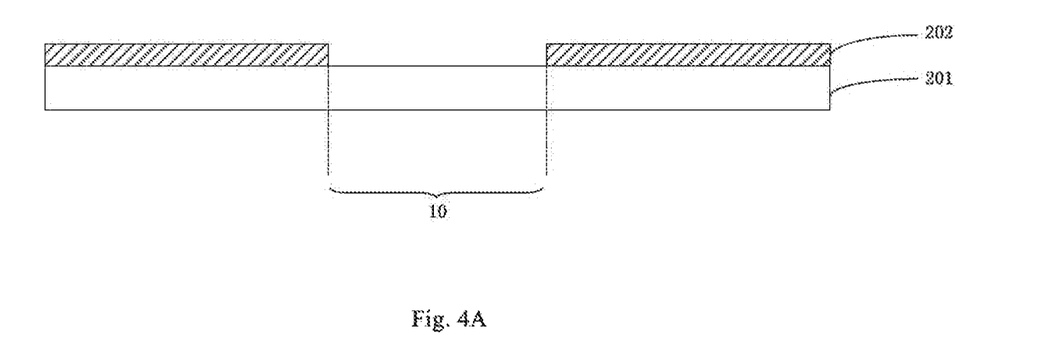
FIGS. 4A-4H illustrate cross-sectional schematic views of structures formed in different stages of forming a display area in a method of fabricating a display panel in accordance with some embodiments of the present disclosure.
Figure 4B:
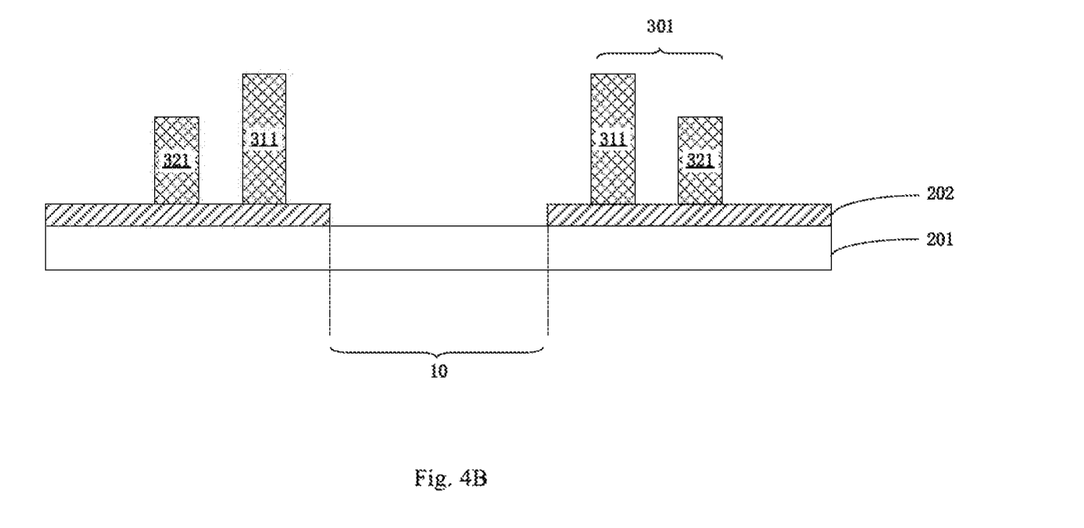
Figure 4C:
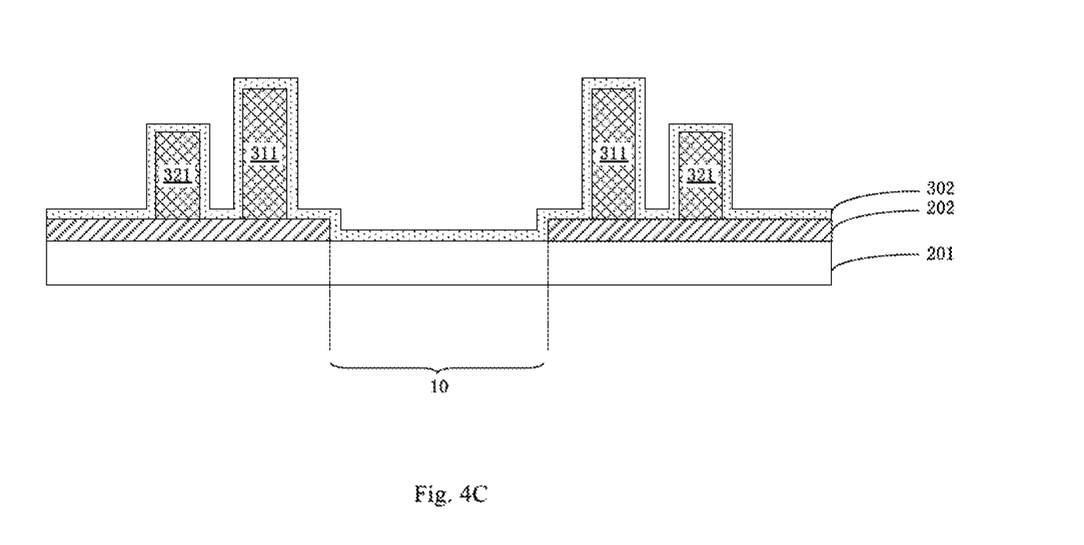
Figure 4D:
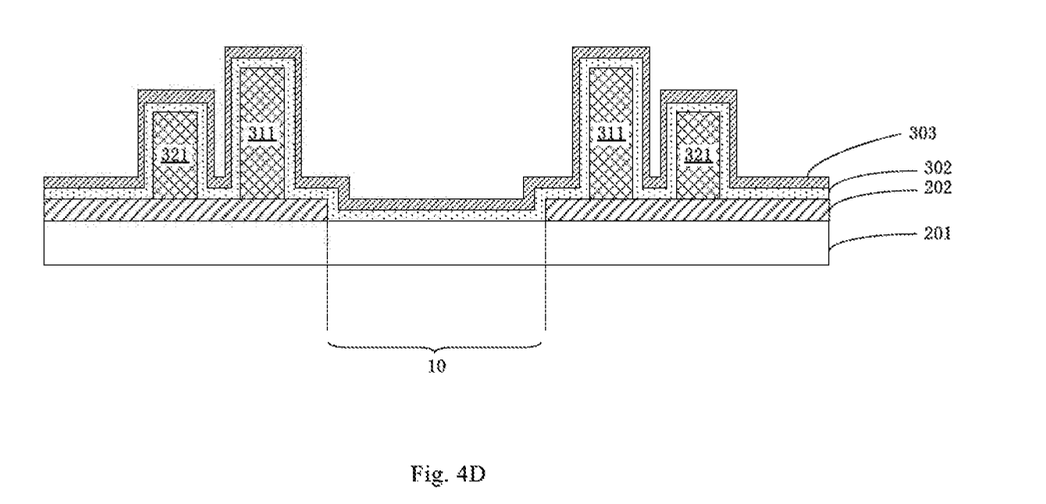
Figure 4E:
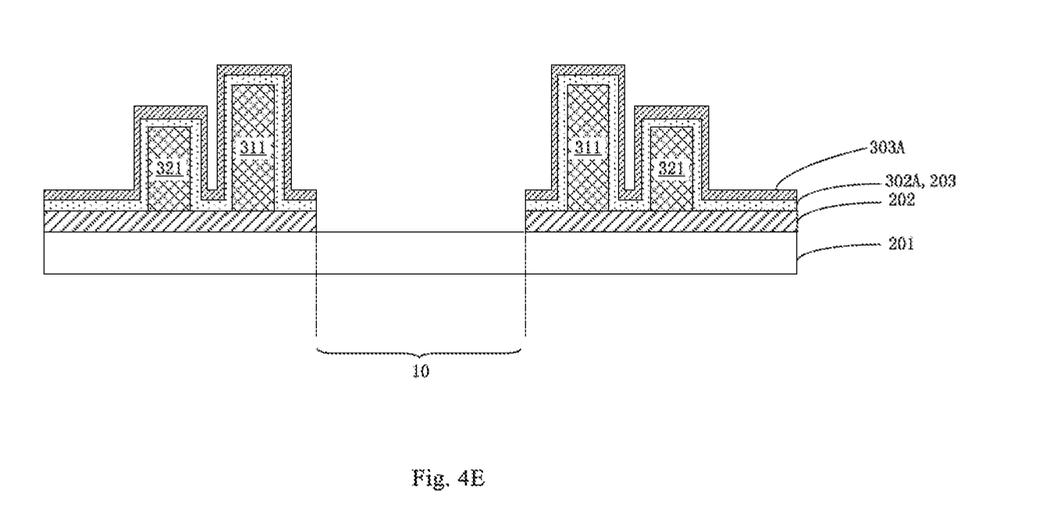

FIGS. 4A-4H illustrate cross-sectional schematic views of structures formed in different stages of forming a display area in a method of fabricating a display panel in accordance with some embodiments of the present disclosure. FIGS. 4E'-4H' illustrate cross-sectional schematic views of structures formed in different stages of forming a display area in a method of fabricating a display panel in accordance with some other embodiments of the present disclosure.

First, as shown in FIG. 4A, a substrate 201 is provided, and a thin film transistor layer 202 is formed on a side of the substrate 201.

Next, as shown in FIG. 4B, at least one dam 301 located on the side of the thin film transistor layer 202 opposite from the substrate 201 is formed. The dam can block the flow of the organic material in the subsequently formed encapsulation layer during the preparation process to prevent the organic material from flowing to the side of the dam near the first opening 10.

For example, the dam 301 may include a first dam 311 and a second dam 321 located on a side of the first dam 311 opposite from the first opening 10. In some embodiments, the height of the first dam 311 is greater than the height of the second dam 321, so that the flow of organic material can be better blocked.

In some embodiments, the first dam 311 may include one or more of the following layers of material stacked from bottom to top: a planarization layer (PLN layer), a pixel defining layer (PDL layer), and a photoresist supporting layer (PS layer). In some embodiments, the second dam 321 can include one or more of the following layers of material stacked from bottom to top: a pixel defining layer and a photoresist supporting layer. That is, in the process of forming the planarization layer, the pixel defining layer, and the photoresist supporting layer of the display panel, the first dam 311 and the second dam 321 may be formed.

Next, as shown in FIG. 4C, a light emitting material layer 302 is deposited on the structure shown in FIG. 4B. It should be understood that the light emitting material layer 302 is deposited on the thin film transistor layer 202, on the surfaces of the first dam 311 and the second dam 321, and on the bottom and sidewalls of the first opening 10.

Next, as shown in FIG. 4D, a first inorganic material layer 303 is formed on a side of the light emitting material layer 302 opposite from the substrate 201. The first inorganic material layer 303 can be formed, for example, by chemical vapor deposition or the like.

Next, an etching process is performed. In some implementations, as shown in FIG. 4E, the etching process can remove portions of the light emitting material layer 302 and the first inorganic material layer 303 that are located inside the first opening 10. Other portions of the light emitting material layer 302 and the first inorganic material layer 303 may remain.

In some embodiments, as shown in FIG. 4E', the etching process may keep portions of the light emitting material layer 302 and the first inorganic material layer 303 at one side of the second dam 321 away from the first opening 10 while removing other portions thereof. In some embodiments, the portion of the light emitting material layer 302 and the first inorganic material layer 303 located on the side surface of the second dam 321 opposite from the first opening 10 may also be removed. As a result, only portions of the light emitting material layer 302 and the first inorganic material layer 303 located on the thin film transistor layer 202 remain.

In some embodiments, as shown in FIG. 4E', the etching process may cause portions of the light emitting material layer 302 and the first inorganic material layer 303 located on one side surface of the second dam 321 opposite from the first opening 10 to remain, and other portions thereof are removed. In some embodiments, the portions of the light emitting material layer 302 and the first inorganic material layer 303 located on the side surface of the second dam 321 opposite from the first opening 10 may also be removed, thereby leaving only portions thereof on the thin film transistor layer 202.

After the etching process is performed, the remaining portion 302A of the light emitting material layer 302A functions as the light emitting layer 203.

In one embodiment, portions of the light emitting material layer 302 and the first inorganic material layer 303 that are not desired to be removed may be blocked by a mask (for example, a photoresist). The light emitting material layer 302 and the first inorganic material layer 303 which are not blocked by the mask are removed by dry etching. Here, when different layers in the light-emitting material layer 302 are removed, the gas corresponding to each layer can be used as an etchant.

Figure 4F:
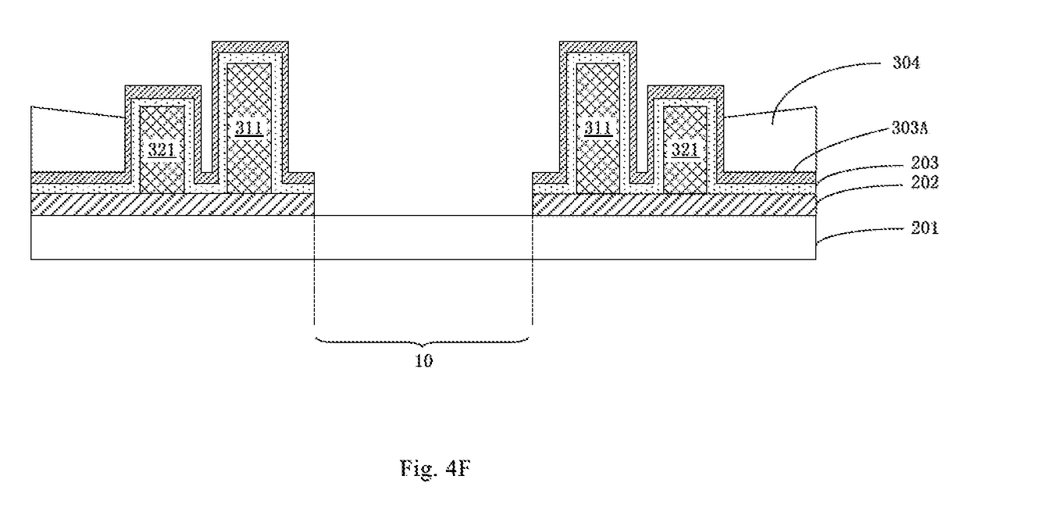

In one embodiment, thereafter, as shown in FIG. 4F and FIG. 4F', an organic material layer 304 is formed. The organic material layer 304 is located on the side of the at least one dam opposite from the first opening 10. The organic material layer 304 is located on the side of the remaining portion 303A of the first inorganic material layer opposite from the substrate 201. Here, in the case where the at least one dam includes the first dam 311 and the second dam 321, the organic material layer is located on a side of the second dam 321 opposite from the first opening 10.

For example, the organic material may be inkjet printed on the remaining portion 303A of the first inorganic material layer to form the organic material layer 304. The first dam 311 and the second dam 321 can block the flow of the organic material during inkjet printing of the organic material.

Figure 4G:
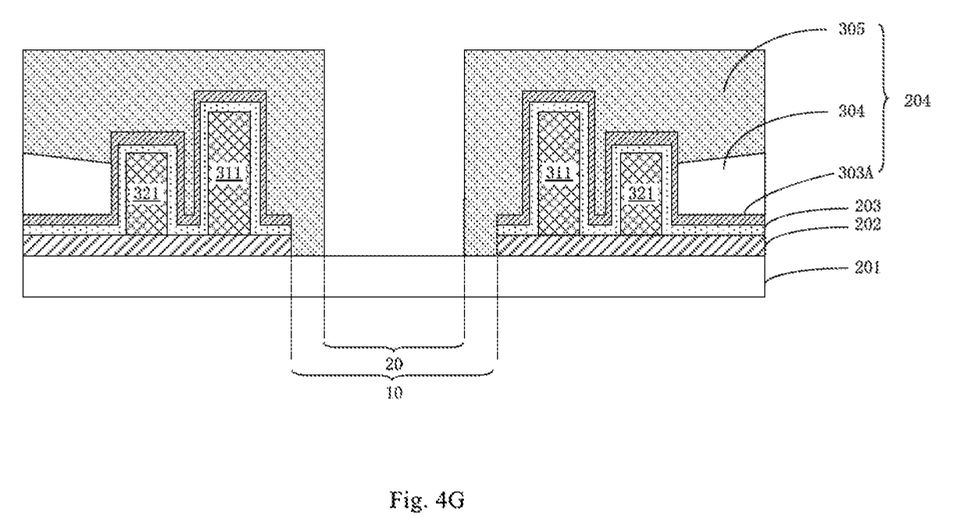

In one embodiment, thereafter, as shown in FIGS. 4G and 4G', a second inorganic material layer 305 covering the organic material layer 304, the light emitting layer 203, and the at least one dam (for example, including the first dam 311 and the second dam 321) is formed. The second inorganic material layer 305 has a second opening 20.

Here, the remaining portion 303A of the first inorganic material layer, the organic material layer 304, and the second inorganic material layer 305 constitute the encapsulation layer 204.

Figure 4H:
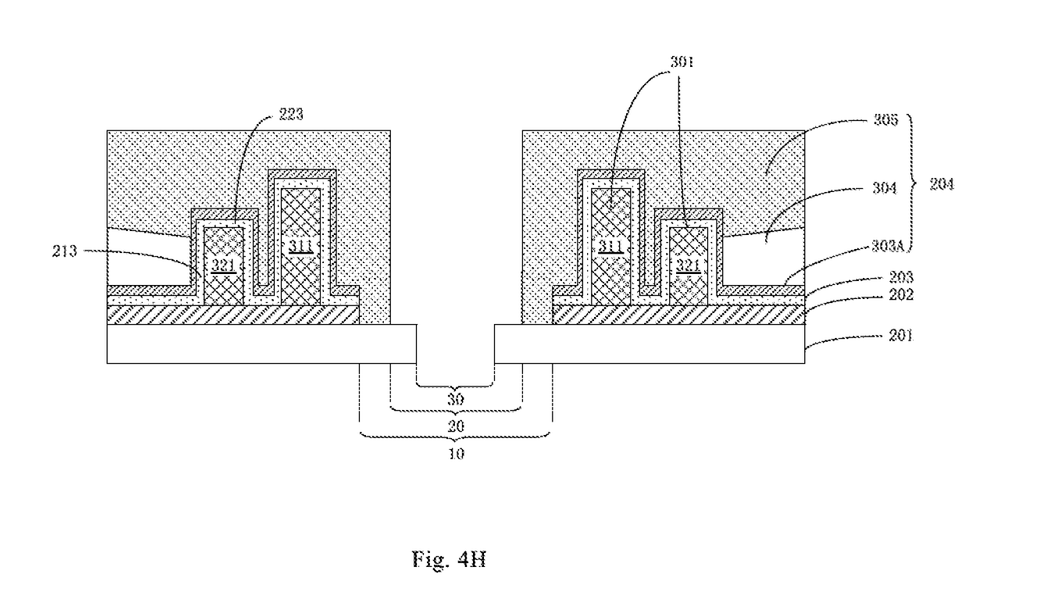

Thereafter, as shown in FIGS. 4H and 4H', a third opening 30 penetrating the exposed portion of the substrate 201 is formed.

For example, the substrate 201 may be cut with a laser to form a third opening 30.

The process of forming a display area in a display panel according to various embodiments of the present disclosure has been described above. The structure of the display area in the display panel according to various embodiments of the present disclosure will be described below with reference to FIGS. 2C, 4H, and 4H'.

In some embodiments, as shown in FIG. 2C, the display area in the display panel includes a substrate 201 having a third opening 30.

The display area further includes a thin film transistor layer 202 on one side of the substrate 201, and the thin film transistor layer 202 has a first opening 10.

The display am further includes a light emitting layer 203 and an encapsulation layer 204 on the side of the thin film transistor layer 202 away from the substrate 201. The encapsulation layer 204 covers the light emitting layer 203 and the thin film transistor layer 202. The encapsulation layer 204 has a second opening 20.

The orthographic projections of the first opening 10, the second opening 20, and the third opening 30 on the substrate 201 are a first projection, a second projection, and a third projection, respectively. The second projection covers the third projection. In some embodiments, the first projection covers the second projection, and the area of the first projection is greater than the area of the second projection.

In other embodiments, as shown in FIGS. 4H and 4H', the side of the thin film transistor layer 202 opposite from the substrate 201 is further provided with at least one dam 301 surrounding the third opening 30. For example, the first dam 311 and the second dam 321 on the side of the first dam 311 opposite from the third opening 30 are provided. In one embodiment, the height of the first dam 311 may be greater than the height of the second dam 321.

At least a portion of the light emitting layer 203 is located on a side of the at least one dam 301 opposite from the third opening 30.

In one embodiment, as shown in FIG. 4H', the light emitting layer 203 may include a first portion 213 which is located on a side of the second dam 321 opposite from the third opening 30. In one embodiment, the first portion 213 may cover a portion of the surface of the thin film transistor layer 202 and a side surface of the second dam 321 opposite from the first opening 10. In some embodiments, the light emitting layer 203 can include only the first portion 213 covering a portion of the surface of the thin film transistor layer 202.

In some embodiments, as shown in FIG. 4H, the light emitting layer 203 may include a second portion 223 in addition to the first portion 213. The second portion 223 may cover at least a portion of the surfaces of the first dam 311 and the second dam 321. In some embodiments, the second portion 223 can be contiguous with the first portion 213. In some embodiments, the second portion 223 may further cover a surface of a portion of the thin film transistor layer 202 between the first dam 311 and the second dam 321 and a surface of the portion of the thin film transistor layer 202 located on the side of the first dam 311 facing the third opening 30.

The present disclosure also provides a display apparatus, which may include the display panel of any of the above embodiments. In some embodiments, the display apparatus can include, for example, a mobile terminal (eg, a cell phone), a television, a display, a notebook, a digital photo frame, a navigator, electronic paper, and the like, with any display product or component.

Heretofore, various embodiments of the present disclosure have been described in detail. In order to avoid obscuring the concepts of the present disclosure, some details known in the art are not described. Those skilled in the art can fully understand how to implement the technical solutions disclosed herein according to the above description.

The principles and the embodiments of the present disclosure are set forth in the specification. The description of the embodiments of the present disclosure is only used to help understand the apparatus and method of the present disclosure and the core idea thereof. Meanwhile, for a person of ordinary skill in the art, the disclosure relates to the scope of the disclosure, and the technical scheme is not limited to the specific combination of the technical features, but also covers other technical schemes which are formed by combining the technical features or the equivalent features of the technical features without departing from the inventive concept. For example, a technical scheme may be obtained by replacing the features described above as disclosed in this disclosure (but not limited to) with similar features.

What is claimed is:

1. A display panel comprising a display area, the display area comprising:
   a substrate having a third opening;
   a thin film transistor layer on a side of the substrate, the thin film transistor layer having a first opening to expose the third opening;
   a light emitting layer on a side of the thin film transistor layer opposite from the substrate; and
   an encapsulation layer on a side of the light emitting layer opposite from the substrate, the encapsulation layer having a second opening to expose the third opening, wherein the encapsulation layer covers side surfaces of the thin film transistor layer facing the second opening;
   orthographic projection of the first opening on the substrate covers the orthographic projection of the second opening on the substrate, and an area of the orthographic projection of the first opening on the substrate is greater than an area of the orthographic projection of the second opening on the substrate; and the orthographic projection of the second opening on the substrate covers orthographic projection of the third opening on the substrate and an area of the orthographic projection of the second opening on the substrate is greater than an area of the orthographic projection of the third opening on the substrate.

2. The display panel of claim 1, wherein the encapsulation layer further covers side surfaces of the light emitting layer facing the second opening and the first opening formed in the light emitting layer and the thin film transistor layer has a same diameter.

3. The display panel of claim 1, wherein at least one dam surrounding the third opening is provided on a side of the thin film transistor layer opposite from the substrate; and at least a portion of the light emitting layer is located on a side of the at least one dam opposite from the third opening.

4. The display panel of claim 3, wherein the at least one dam includes a first dam and a second dam located on a side of the first dam opposite from the third opening.

5. The display panel of claim 4, wherein a height of the first dam is greater than a height of the second dam.

6. The display panel of claim 5, wherein the light emitting layer comprises a first portion covering a side surface of the second dam opposite from the third opening and a surface of a portion of the thin film transistor layer on a side of the second dam opposite from the third opening.

7. The display panel of claim 5, wherein the light emitting layer comprises a first portion covering a surface of a portion of the thin film transistor layer on a side of the second dam opposite from the third opening.

8. The display panel of claim 6, wherein the light emitting layer further comprises a second portion covering at least a portion of surfaces of the first dam and the second dam.

9. The display panel of claim 8, wherein the second portion further covers a surface of a portion of the thin film transistor layer on a side of the first dam facing the third opening.

10. The display panel of claim 6, wherein the second portion is contiguous with the first portion.

11. A display apparatus, comprising the display panel according to claim 1.

12. The display apparatus of claim 11, further comprising a camera disposed in the third opening.

13. A method of manufacturing a display panel, comprising forming a display area, the forming the display area comprising:

providing a substrate;

forming a thin film transistor layer on a side of the substrate, the thin film transistor layer having a first opening exposing a portion of the substrate;

forming a light emitting layer on a side of the thin film transistor layer opposite from the substrate;

forming an encapsulation layer covering the light emitting layer and the thin film transistor layer, the encapsulation layer having a second opening exposing at least a portion of the exposed portion of the substrate; and forming a third opening penetrating the exposed portion of the substrate, wherein orthographic projection of the second opening on the substrate covers orthographic projection of the third opening on the substrate.

14. The method of manufacturing a display panel of claim 13, wherein orthographic projection of the first opening on the substrate covers the orthographic projection of the second opening on the substrate, and an area of the orthographic projection of the first opening on the substrate is greater than an area of the orthographic projection of the second opening on the substrate.

15. The method of manufacturing a display panel of claim 13, before forming the light emitting layer and the encapsulation layer, further comprising:

forming at least one dam located on a side of the thin film transistor layer opposite from the substrate;

wherein at least a portion of the light emitting layer is located on a side of the at least one dam opposite from the first opening.

16. The method of manufacturing a display panel of claim 15, wherein the forming the light emitting layer and the encapsulation layer comprises:

depositing a layer of light emitting material after forming the at least one dam;

forming a first inorganic material layer on a side of the layer of the light emitting material opposite from the substrate;

performing an etching process to remove portions of the layer of the light emitting material and the first inorganic material layer in the first opening;

forming an organic material layer on a side of the at least one dam opposite from the first opening and on a side of the remaining portion of the first inorganic material layer opposite from the substrate; and forming a second inorganic material layer covering the organic material layer, the layer of the light emitting material, and the at least one dam, wherein the second inorganic material layer has an opening the same as the second opening.

17. The method of manufacturing a display panel of claim 16, wherein the etching process is performed to further remove portions of the layer of the light emitting material and the first inorganic material layer except those located at a side of the second dam opposite from the first opening.

18. The method of manufacturing a display panel of claim 15, wherein the at least one dam comprises a first dam and a second dam located on a side of the first dam opposite from the first opening.

19. The method of manufacturing a display panel of claim 18, wherein a height of the first dam is greater than a height of the second dam.

20. The display panel of claim 1, wherein the encapsulation layer includes a first inorganic material layer, an organic material layer on the first inorganic material layer, and a second inorganic material layer on the organic material layer; and a height of the organic material layer is lower than a height of the at least one dam.

* * * * *